(12) United States Patent
Nordmeyer-Massner et al.

(10) Patent No.: US 7,619,416 B2
(45) Date of Patent: Nov. 17, 2009

(54) COIL ASSEMBLY AND MULTIPLE COIL ARRANGEMENT FOR MAGNETIC RESONANCE IMAGING

(75) Inventors: Jurek Nordmeyer-Massner, Zürich (CH); Nicola De Zanche, Edmonton (CA); Klass Prüssmann, Zürich (CH)

(73) Assignees: Universität Zürich Prorektorat Forschung Eidgenössische Technische Hochschule, Zürich (CH); Eidgenössische Technische Hochschule, Zürich (CH)

( * ) Notice: Subject to any disclaimer, the term of this patent is extended or adjusted under 35 U.S.C. 154(b) by 85 days.

(21) Appl. No.: 12/104,854

(22) Filed: Apr. 17, 2008

(65) Prior Publication Data

US 2009/0261828 A1    Oct. 22, 2009

(51) Int. Cl.
    *G01V 3/00* (2006.01)
(52) U.S. Cl. .......................... 324/318; 324/322
(58) Field of Classification Search ................. 324/318, 324/322
    See application file for complete search history.

(56) References Cited

U.S. PATENT DOCUMENTS

| 4,920,318 | A |   | 4/1990 | Misic et al. |
| 5,548,218 | A | * | 8/1996 | Lu ............................. 324/318 |
| 5,905,378 | A | * | 5/1999 | Giaquinto et al. ........... 324/318 |
| 6,461,307 | B1 | * | 10/2002 | Kristbjarnarson et al. ... 600/534 |
| 7,443,163 | B2 | * | 10/2008 | Warntjes et al. ............. 324/318 |
| 2008/0204021 | A1 | * | 8/2008 | Leussler et al. ............. 324/318 |

FOREIGN PATENT DOCUMENTS

WO    2005124380 A2    12/2005

* cited by examiner

*Primary Examiner*—Louis M Arana
(74) *Attorney, Agent, or Firm*—McCormick, Paulding & Huber LLP

(57) ABSTRACT

A coil assembly for magnetic resonance imaging comprises a sheet (2) of flexible and stretchable dielectric material and at least one electrically conducting coil (4a, 4b) for receiving and/or emitting a radio frequency signal. The coil is attached to and extends along a face of the flexible sheet. At least part of the coil is made of a ribbon shaped braided conductor (6) that is arranged in substantially flat contact with the face.

20 Claims, 4 Drawing Sheets
(1 of 4 Drawing Sheet(s) Filed in Color)

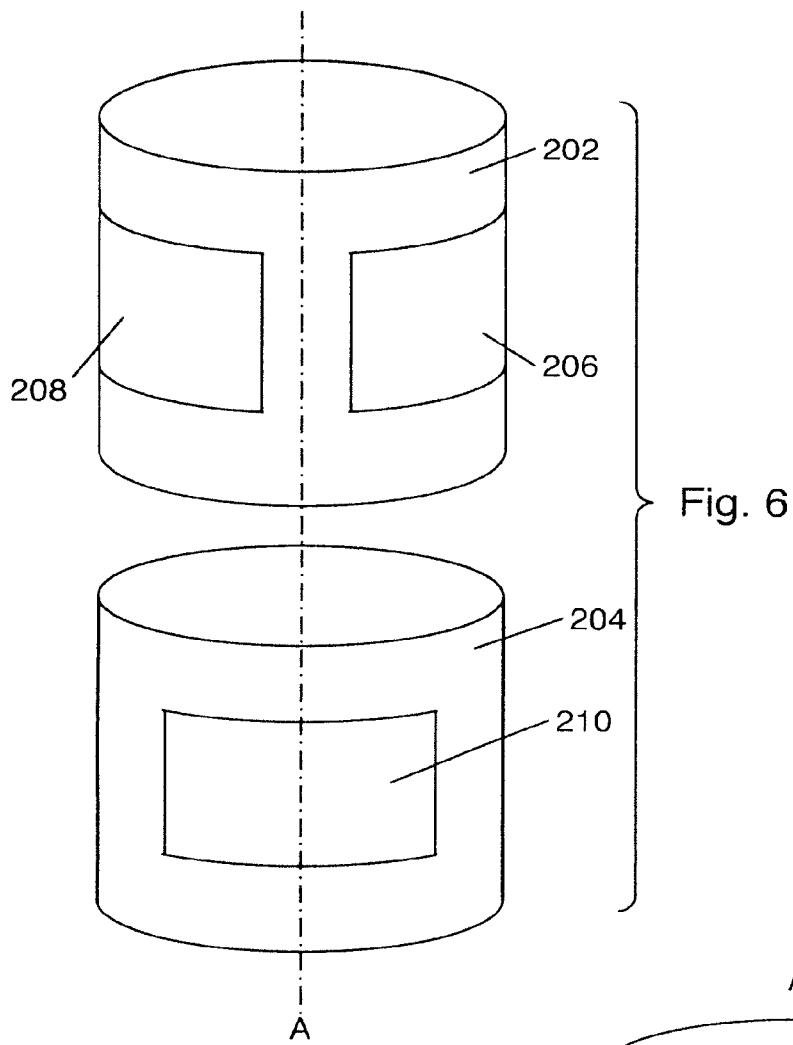
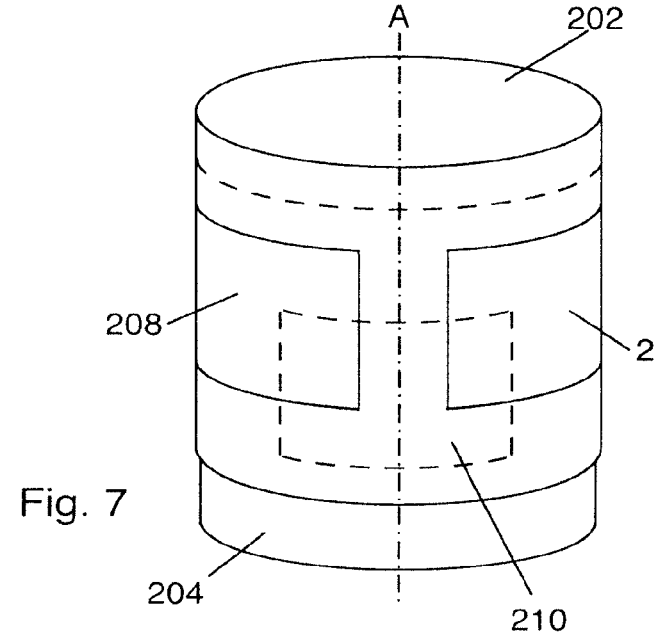
Fig. 6
Fig. 7

COIL ASSEMBLY AND MULTIPLE COIL ARRANGEMENT FOR MAGNETIC RESONANCE IMAGING

FIELD OF THE INVENTION

The present invention relates to a coil assembly and to a multiple coil arrangement for magnetic resonance imaging.

BACKGROUND OF THE INVENTION

Arrays of surface receiver coils in magnetic resonance imaging (MRI) have several advantages over volume coils such as TEM or birdcage coils. The most important advantage is an improvement in the signal-to-noise ratio (SNR) which is due to the ability to bring surface coils closer to the subject's body, leading to a stronger MRI signal. Surface coils' intrinsically lower sensitivity to noise from the body also contributes to an enhanced SNR, which can be used to improve image quality, reduce scan times, or to implement parallel imaging techniques such as sensitivity encoding (SENSE).

Optimal SNR performance is achieved by covering the imaging region on the subject as completely as possible and with a large number of coils. In practice, this requires having arrays of mechanically individual coils of a number of different sizes and shapes to cover as many imaging situations and patient sizes as possible. Positioning such individual coils, however, becomes challenging for the MRI staff, and stressful and uncomfortable for the patient. Furthermore, this procedure would need to be repeated for each patient leading to an inefficient use of time and resources.

In order to overcome this problem, it was proposed in WO 2005/124380 A2 to use an arrangement comprising a plurality of coils attached to a flexible and stretchable item of clothing. The individual coils are relatively movable with respect to one another responsive to stretching of the item of clothing.

However, a disadvantage of the arrangement disclosed in WO 2005/124380 A2 is the inability of the conductors to return to their original configuration even after just a few stretching cycles. For example, in the embodiment shown in FIG. 6 of WO 2005/124380 A2, the coils are formed by individual flexible conductive wires that are embedded or intertwined in a multilayered fabric. Although such a coil arrangement exhibits good flexibility, it suffers from a lack of stretchability and stability. This is due to the fact that the conductive wires form a wave-like structure within a plane that is substantially perpendicular to the principal plane of the multilayered fabric. Stretching the fabric in a direction within its principal plane and along the conductive wires initially reduces the amplitude of the wavelike structure until the conductive wires are substantially straight. Beyond this comparatively small extension range that is primarily determined by the initial amplitude and hence by the layer thickness, any further stretching of the fabric would require an extension of the conductive wires, which is generally an inelastic process and hence is irreversible.

SUMMARY OF THE INVENTION

It is the principal object of the present invention to overcome the limitations and disadvantages, particularly the limited stretchability and number of stretching cycles, of currently known coil assemblies for magnetic resonance imaging.

According to one aspect of the invention, a coil assembly for magnetic resonance imaging comprises a sheet of flexible and stretchable dielectric material and at least one electrically conducting coil for receiving and/or emitting a radio frequency signal, the coil being attached to and extending along a face of said flexible sheet, at least part of said coil being a flexible conductor segment that is stretchable in a longitudinal direction thereof lying in a plane of said face, said conductor segment comprising at least one conducting element extending along a curved path within said plane, whereby a longitudinal stretching of said conductor segment is associated with a straightening of said curved path.

By virtue of these features the coil assembly has a substantially enhanced stretchability.

The design of the coil assembly allows it to adapt to a patient's body part on which it is worn. Due to the fact that the conducting element(s) forming the conductor segment extend(s) along a curved path that lies in the plane, provision is made for a geometric length reserve of the conductor segment. In other words, extension of the conductor segment in longitudinal direction does not require any plastic deformation of the conductor material, since it is achieved by mere straightening of a curved arrangement. Accordingly, the conductor segment can bend and stretch repeatedly. Moreover, the flexible and stretchable sheet provides the tension that is needed to pull the conductor back into the "relaxed", i.e. unstretched position of the coil array when it is taken off.

In addition to providing mechanical tension, the stretchable sheet protects the patient from direct contact with any conducting material and makes wearing the coil assembly much more comfortable than the prior art approach using non-stretchable coils, either individually mounted or attached to a fabric (see e.g. WO 2005/124380 A2, FIGS. 3A and 3B).

Advantageous embodiments are defined in the dependent claims.

In principle, the stretchable conductor segment could be formed of a single wire that is arranged in wavelike or meandering fashion within a plane corresponding to the face of said flexible sheet. Stretching the conductor leads to straightening out of the wire's path, i.e. the amplitude of the wavelike or meandering pattern is reduced. According to a particularly advantageous embodiment, the stretchable conductor segment is made of a ribbon shaped braided conductor that is arranged in substantially flat contact with said face.

Advantageously, the braided conductor is attached to the flexible and stretchable sheet at regular intervals by sewing or any other technique that does not alter the stretching properties of the sheet and/or braided conductor. A good mechanical connection between conductor and sheet is needed for the coil element itself to return to its original length after being stretched. For example, the coil is attached to the sheet by means of stitches.

Advantageously, the braided conductor is made of a plurality of metal wires, preferably copper wires. Thin uninsulated copper wires woven or braided together allow the single strands to support each other without the need for each one to be individually attached or woven into a fabric support as implied by FIG. 6 of WO 2005/124380 A2. Depending on the width of the braid and the number and size of copper strands, stretches exceeding 50% can be realized. Copper braid has various applications in electronics, but only the versions with a large number of thin and tightly woven strands are preferred for the construction of wearable coil assemblies for MRI. Furthermore, the copper strands may be woven together with synthetic or natural fibers such as Kevlar or cotton to increase the strength and/or elasticity of the braid.

Alternative embodiments take advantage of other metals' higher conductivity as compared to copper by:
a) using gold or silver strands instead of copper to make the braid;
b) plating copper strands with silver or gold;
c) plating strands of another metal (e.g. steel for its superior strength and resistance to mechanical fatigue) with copper, silver or gold.

Preferably, the flexible and stretchable sheet is made from a textile. In particular, it may be made of the material commonly used for elastic bandages. Nevertheless, in certain circumstances it may be necessary to provide further tensioning means for keeping said coil in substantially flat contact with a subject or object to be examined.

Advantageously, the coil assembly further comprises connection means for connecting said coil assembly to at least one further coil assembly. This embodiment allows for modular build-up of larger coil arrangements from individual building blocks.

Changes to the resonance frequency of the coils due to stretching have to be taken into account. One way is compensation by circuits containing varactor diodes, as disclosed in U.S. Pat. No. 4,920,318. Accordingly, in a further embodiment of the present invention, the coil assembly comprises means for determining the stretching state of the flexible and stretchable sheet and therefore indirectly determining the current resonance frequency of the coil. This is achieved by attaching a plurality of strain gauges to the sheet in order to measure the amount of stretching at various locations of the sheet. The measured stretch values are then used to generate the correct voltages on the varactors, thus compensating the changes in inductance by changes in the diodes' capacitance. The required voltages can be calculated from the measured stretches using computer algorithms or by implementing the desired function using operational amplifiers or similar analog electronic circuits.

Alternatively, the resonance frequency of the coil is measured directly after application to the object or subject by a connected spectrometer or other instruments for frequency measurements. A computer controlled circuitry containing variable capacitors, i.e. varactor diodes, is adjusted accordingly to the frequency measurement to reach a given resonant frequency.

Alternatively, the coil is combined with a second resonant circuit, i.e. a matching circuit which resonates at the same frequency as the coil in the "relaxed" state. This results in splitting of the resonance peak where the measurement frequency is located on a saddle between the two peaks. Changes in the resonance frequency of the coil will lead only to small changes in the position of the two peaks hence leaving the saddle almost unaffected. Therefore changes in the resonance frequency of the coil can be tolerated without actively compensating for it.

According to another aspect of the invention, a coil assembly for magnetic resonance imaging, comprises a sheet of flexible and stretchable dielectric material; and a plurality of electrically conducting coils for receiving and/or emitting a radio frequency signal, each coil being attached to and extending along a face of said flexible sheet, at least part of each coil being made of a ribbon shaped braided conductor that is arranged substantially parallel to said face, wherein at least one pair of adjacent coils is disposed mutually overlapping geometrically but is mutually separated electrically by means of electric insulation means.

The adoption of overlapping coils is known in the art and is used to achieve approximate inductive decoupling. Electric insulation means provided to achieve mutual electric separation of overlapping adjacent coils preferably comprise a layer of flexible and stretchable dielectric material that is arranged between the overlapping coils in sandwich-like manner.

According to a further aspect of the invention, a multiple coil arrangement for magnetic resonance imaging comprises at least two coil assemblies, each coil assembly comprising a sheet of flexible and stretchable dielectric material, and at least one electrically conducting coil for receiving and/or emitting a radio frequency signal, at least part of each coil being a flexible conductor segment that is stretchable in a longitudinal direction thereof lying in a plane of said face, said conductor segment comprising at least one conducting element extending along a curved path within said plane, whereby a longitudinal stretching of said conductor segment is associated with a straightening of said curved path, wherein said coil assemblies are arranged axially displaced with respect to each other against an object or subject of interest. Such an arrangement is particularly useful for carrying out MRI of large body portions, since it allows a modular build-up from individual coil assemblies.

Advantageously, the coil assemblies are disposed in such way that respective coils mutually overlap each other geometrically but are mutually separated electrically by means of electric insulation means. It will be understood that such electric insulation means may comprise the sheets of flexible and stretchable dielectric material to which the coils are attached to.

In a particularly advantageous embodiment of the multiple coil arrangement, each one of said coil assemblies is substantially sleeve-shaped. Such an arrangement is ideally suited for MR imaging of joints such as knee, ankle, elbow and finger joints, since it allows measurements at different flexion angles without having to rearrange the coils. In combination with fast imaging sequences, highly-sensitive dynamic imaging of the knee joint is a promising perspective. Patients will appreciate the fact that a stretchable coil array is worn essentially like a normal piece of clothing or an elastic bandage.

The devices according to the present invention can be designed so as to be easily washable or even disposable in order to meet requirements on clinical hygiene and to provide every patient with a clean sterile coil. Alternatively, designs that allow the coil to be autoclaved or disinfected by similar techniques are possible.

BRIEF DESCRIPTION OF THE DRAWINGS

The file of this patent contains at least one drawing executed in color. Copies of this patent with color drawing(s) will be provided by the Office upon request and payment of the necessary fee.

The above mentioned and other features and objects of this invention and the manner of achieving them will become more apparent and this invention itself will be better understood by reference to the following description of various embodiments of this invention taken in conjunction with the accompanying drawings, wherein:

FIG. 6 shows two coil assemblies of a multiple coil arrangement in a non-overlapping position, in a schematic perspective view;

FIG. 7 shows the two coil assemblies of FIG. 6 in an overlapping position, in a schematic perspective view;

DESCRIPTION OF THE PREFERRED EMBODIMENTS

Figure 1:
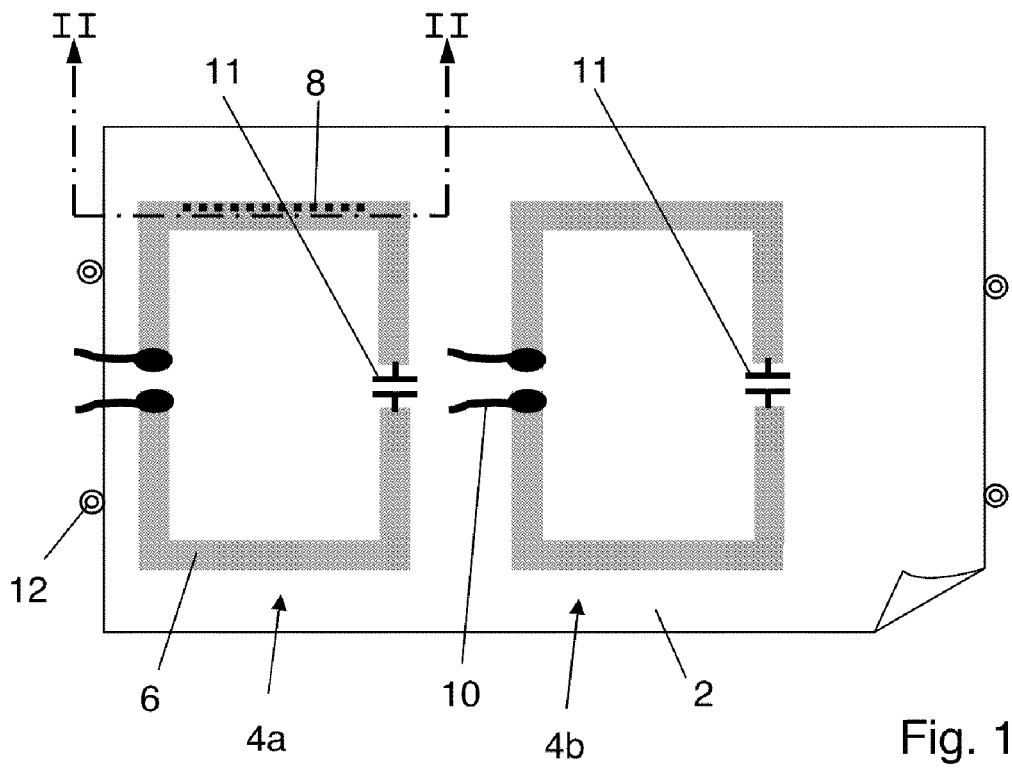
FIG. 1 shows a first embodiment of a stretchable coil assembly, in a schematic top view.
Figure 2:
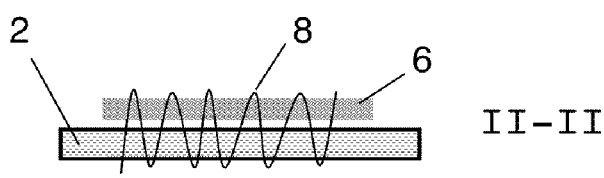
FIG. 2 shows the coil assembly of FIG. 1 according to section II-II of FIG. 1.

The coil assembly shown in FIGS. 1 and 2 comprises a sheet 2 of a flexible and stretchable dielectric textile material and two coils formed by substantially rectangular electrically conducting loops 4a and 4b. Each coil is made of a ribbon shaped braided conductor 6 that is attached to the sheet by means of stitches 8 so as to be arranged in substantially flat contact on a face of the sheet. The respective ends of the coils are each provided with an electrical connector 10 for connection to associated electronics via flexible copper wires, braids or cables. This allows placing the circuitry for preamplification, tuning, matching and detuning where it will not interfere with the coil element itself or with the patient's comfort. Moreover, each coil is provided with an appropriate capacitor 11 to reach the desired resonance frequency.

Mechanical connection means 12, for example in the form of hooks and eyes, are arranged at the margins of sheet 2 for connecting the coil assembly to further coil assemblies.

Figure 3A:
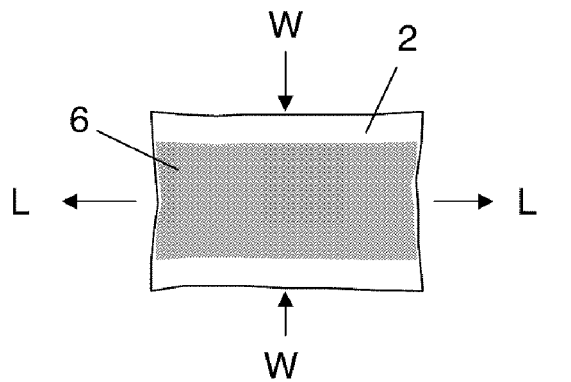
FIG. 3 shows a portion of the coil assembly of FIG. 1, in a schematic top view, in a non-stretched state (a) and in a longitudinally stretched state (b)
Figure 3B:
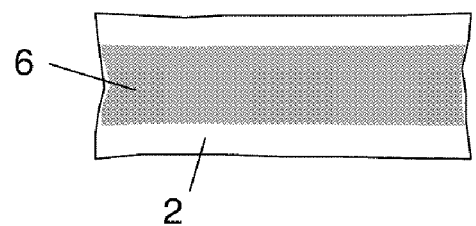

As shown in FIGS. 3a and 3b, stretching the ribbon shaped braided conductor 6 in longitudinal direction L leads to a narrowing of the ribbon's width W. As will be understood, this allows for substantial stretching without extension of the individual conductor strands.

Figure 4:
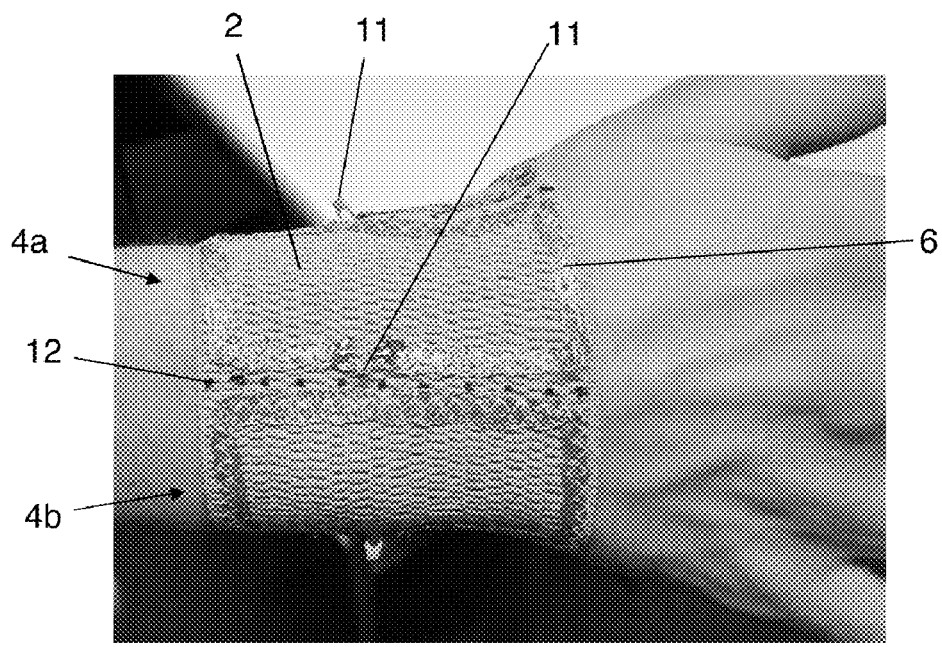
FIG. 4 shows a color photograph of a stretchable coil assembly according to the first embodiment, arranged around a patient's wrist.

An implementation of the flexible coil assembly is shown in FIG. 4, which is a photograph of a stretchable coil assembly arranged around a patient's wrist. Reference numerals denote the same features as in FIGS. 1 to 3. However, electrical connectors (denoted as 10 in FIG. 1) are not yet attached in the arrangement shown in FIG. 4.

Figure 5:
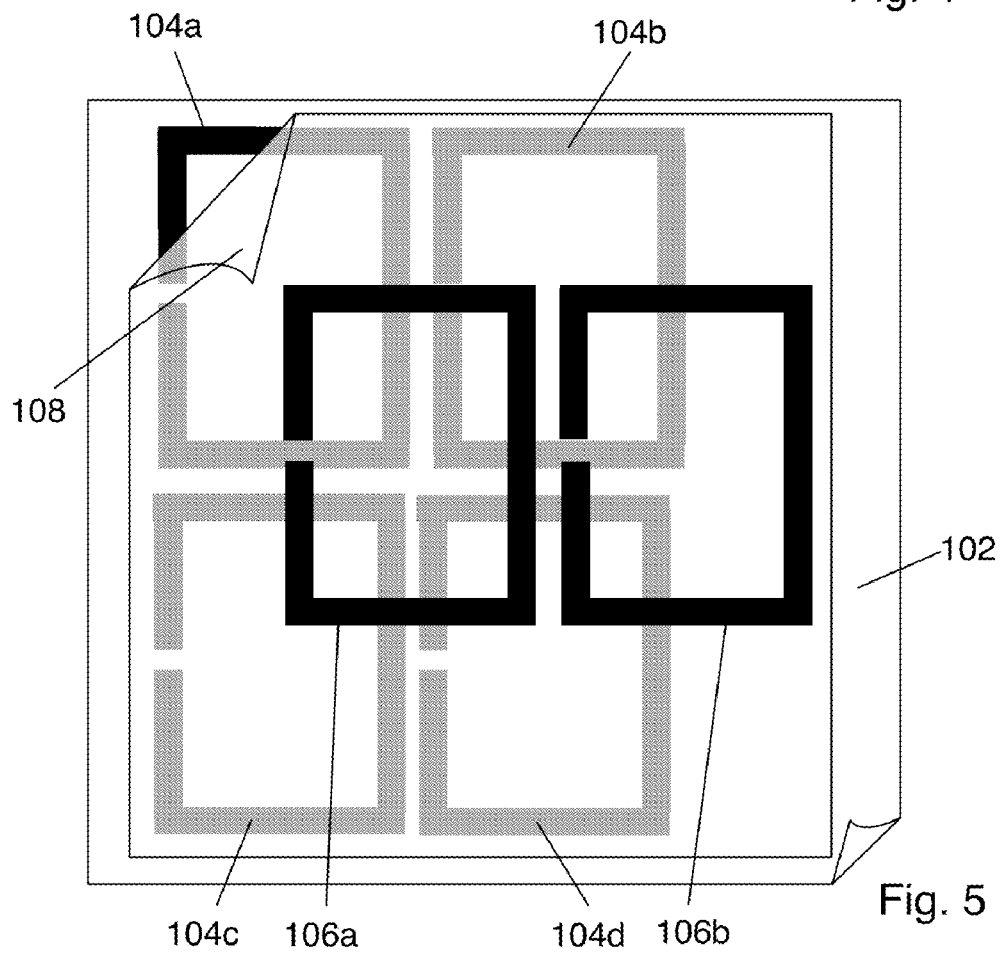
FIG. 5 shows a second embodiment of a stretchable coil assembly, in a schematic top view.

The coil assembly shown in FIG. 5 comprises a sheet 102 of a flexible and stretchable dielectric textile material and four coils formed by substantially rectangular electrically conducting loops 104a, 104b, 104c and 104d. Each coil is made of a ribbon shaped braided conductor that is attached to sheet 102 so as to be arranged in substantially flat contact on the upper face of sheet 102. The respective ends of the coils are each provided with an electrical connector (not shown in the drawing) for connection to associated electronics via flexible copper wires, braids or cables as explained for the assembly of FIG. 1. The lower face of sheet 102, i.e. the face thereof directed away from the four coils, is intended to be contacted with the surface of an object or subject to be examined.

Two further substantially rectangular conducting loops 106a and 106b are disposed mutually overlapping with the first four loops. As will be appreciated from the drawing, there is a pairwise geometric overlap between loop 106a with each one of loops 104a, 104b, 104c and 104d, and there is also a pairwise overlap between loop 106b and loops 104b and 104d. However, each pair of geometrically overlapping loops is separated electrically by a layer 108 of a flexible and stretchable dielectric material that is arranged therebetween as an electric insulation means. It will be understood that the arrangement with six loops as shown in FIG. 5 is merely intended as an exemplification. Moreover, the insulating layer 108 may actually be made of the same material as sheet 102. Indeed, an arrangement as shown in FIG. 5 may be obtained by overlapping two coil assemblies of the type shown in FIG. 1.

This is further illustrated in FIGS. 6 and 7, which show a multiple coil arrangement comprising two substantially cylindrical, sleeve-shaped coil assemblies 202 and 204, each formed of a flexible and stretchable dielectric textile material. In this example, each one of the coil assemblies comprises two substantially rectangular electrically conducting loops covering approximately 45% of the sleeve circumference. Specifically, coil assembly 202 has a first loop 206 and a second loop 208, whereas coil assembly 204 has a first loop 210 and a second loop not visible in the views of FIGS. 6 and 7. In the position shown in FIG. 6, the two coil assemblies are disposed substantially co-axially with respect to a longitudinal axis A but longitudinally displaced from each other so that there is no overlap of the two sleeve-shaped assemblies. In the position shown in FIG. 7, assembly 206 is disposed partially overlapping assembly 204. In this configuration loop 210 is arranged underneath loops 206 and 208, with the dielectric textile material of assembly 202 acting as electric insulation means. For example, the two coil assemblies can be applied around a patient's knee, with the longitudinal axis A corresponding to a longitudinal axis of the patient's leg with the knee unbent. By virtue of the geometric adaptability of this multiple coil arrangement, it is possible to take MR images of the knee at different flexion angles, as demonstrated by the following example.

EXAMPLE

Figure 8:
FIG. 8 shows an MR image of a knee of a healthy volunteer, acquired in a transverse plane by means of a multiple coil arrangement of the type shown in FIG. 7.
Figure 9A:
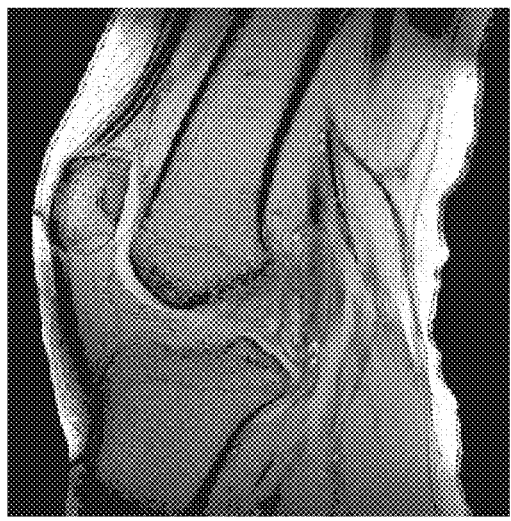
FIG. 9 shows MR image of a knee of a healthy volunteer with nearly extended knee (a) and with flexed knee (b), acquired in a sagittal plane by means of a multiple coil arrangement of the type shown in FIG. 7.
Figure 9B:

The images of FIGS. 8 and 9 were taken by means of an eight-coil arrangement formed from four sleeve-shaped coil assemblies each having two substantially rectangular coils arranged around the sleeve circumference. The loops were formed of 5 mm wide copper braid sewn to stretchable fabric made of cotton and polyamide. Overlapped coil elements were used for approximate geometric decoupling. Residual coupling was suppressed by preamplifier decoupling (see e.g. Roemer et al., MRM 16, p. 192 (1990)) similarly to the procedure explained in Mass-ner et al., Proc. ISMRM, p. 1051 (2007).

The array consists of four rings of fabric with two coil elements each at diametrically opposite locations. Pairs of such rings were overlapped with a rotation of 90° to form a ring of four overlapping elements. The circumference in the relaxed state was 340 mm and can be stretched to about 440 mm to accommodate various knee sizes. The two four-element rings were arranged with an axial overlap of 20 mm, leading to a field of view (FOV) of approximately 170 mm along the length of the leg. The coils were connected through a multi-channel interface box to a 3T Philips Achieva system (Philips Healthcare, Best, The Netherlands). Imaging was performed on a healthy volunteer using a gradient echo sequence in transverse (TE 4.9 ms, TR 77 ms, FOV 140 mm) and sagittal (TE 4.1 ms, TR 63 ms, FOV 200 mm) orientations with a slice thickness of 5 mm, acquisition matrix 512×410, 8 averages. The inplane resolution was 270×340 µm for the transverse and 390×490 µm$^2$ for the sagittal images. Sagittal images were taken consecutively at two different flexion angles of the knee without any adjustments to the coil array.

FIG. 8 shows a transverse slice of the knee at the level of the patella whereas FIG. 9 shows two sagittal slices, one with the knee extended (a) and one with the knee flexed (b). These data confirm both a high overall SNR yield and robust homogeneous coverage even with major changes in the coils' stretching state and relative position. Coupling artifacts or transmit B1 distortions were not observed, indicating robust preamplifier decoupling and detuning performance.

It will be understood that although the coils shown in the present examples were of substantially rectangular shape, other coil shapes may be adopted. In particular, it is contemplated to use substantially circular coil shapes.

The invention claimed is:

1. A coil assembly for magnetic resonance imaging, comprising:
    a sheet of flexible and stretchable dielectric material; and
    at least one electrically conducting coil for receiving and/or emitting a radio frequency signal, each coil being attached to and extending along a face of said flexible sheet;
    wherein
    at least part of said coil is a flexible conductor segment that is stretchable in a longitudinal direction thereof lying in a plane of said face, said conductor segment comprises at least one conducting element extending along a curved path within said plane, whereby a longitudinal stretching of said conductor segment is associated with a straightening of said curved path.

2. The coil assembly according to claim 1, wherein said conductor segment is made of a ribbon shaped braided conductor that is arranged in substantially flat contact with said face.

3. The coil assembly according to claim 2, wherein said braided conductor is made of a plurality of metal wires.

4. The coil assembly according to claim 1, wherein said sheet is a flexible and stretchable textile.

5. The coil assembly according to claim 1, further comprising tensioning means for keeping said coil in substantially flat contact against a subject or object to be examined.

6. The coil assembly according to claim 1, further comprising a mechanical connection connecting said coil assembly to at least one further coil assembly.

7. The coil assembly according to claim 1, further comprising means for determining a resonance characteristic of at least one coil.

8. A coil assembly for magnetic resonance imaging, comprising:
    a sheet of flexible and stretchable dielectric material; and
    a plurality of electrically conducting coils for receiving and/or emitting a radio frequency signal, each coil being attached to and extending along a face of said flexible sheet;
    at least part of each coil being a flexible conductor segment that is stretchable in a longitudinal direction thereof lying in a plane of said face, said conductor segment comprising at least one conducting element extending along a curved path within said plane, whereby a longitudinal stretching of said conductor segment is associated with a straightening of said curved path;
    wherein at least one pair of adjacent coils is disposed mutually overlapping geometrically but is mutually separated electrically by means of electric insulation.

9. The coil assembly according to claim 8, wherein said conductor segment is made of a ribbon shaped braided conductor that is arranged in substantially flat contact with said face.

10. The coil assembly according to claim 9, wherein said braided conductor is made of a plurality of metal wires.

11. The coil assembly according to claim 8, wherein said electric insulation means comprise a layer of flexible and stretchable dielectric material.

12. The coil assembly according to claim 8, wherein said sheet is a flexible and stretchable textile.

13. The coil assembly according to claim 8, further comprising tensioning means for keeping said coil in substantially flat contact against a subject or object to be examined.

14. The coil assembly according to claim 8, further comprising a mechanical connection connecting said coil assembly to at least one further coil assembly.

15. The coil assembly according to claim 8, further comprising means for determining a resonance characteristic of at least one coil.

16. A multiple coil arrangement for magnetic resonance imaging, comprising at least two coil assemblies, each coil assembly comprising:
    a sheet of flexible and stretchable dielectric material; and
    at least one electrically conducting coil for receiving and/or emitting a radio frequency signal, each coil being attached to and extending along a face of said flexible sheet;
    at least part of said coil being made of a ribbon shaped braided conductor that is arranged in substantially flat contact with said face;
    wherein said coil assemblies are arranged axially displaced with respect to each other against an object or subject of interest.

17. The multiple coil arrangement according to claim 16, wherein at least one coil of a first one of said coil assemblies and one coil of a second one of said coil assemblies are disposed mutually overlapping each other geometrically but are mutually separated electrically by means of electric insulation.

18. The multiple coil arrangement according to claim 17, wherein said electric insulation comprises said sheet of flexible and stretchable dielectric material of one of said coil assemblies.

19. The multiple coil arrangement according to claim 18, wherein each one of said coil assemblies is substantially sleeve-shaped.

20. The multiple coil arrangement according to claim 16, wherein said braided conductor is made of a plurality of metal wires.

* * * * *